(12) United States Patent
Frohberg et al.

(10) Patent No.: US 7,871,941 B2
(45) Date of Patent: Jan. 18, 2011

(54) METHOD FOR REDUCING RESIST POISONING DURING PATTERNING OF STRESSED NITROGEN-CONTAINING LAYERS IN A SEMICONDUCTOR DEVICE

(75) Inventors: Kai Frohberg, Niederau (DE); Ralf Richter, Dresden (DE); Thomas Werner, Reichenberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 868 days.

(21) Appl. No.: 11/743,502

(22) Filed: May 2, 2007

(65) Prior Publication Data

US 2008/0081481 A1    Apr. 3, 2008

(30) Foreign Application Priority Data

Sep. 29, 2006    (DE) ................ 10 2006 046 381

(51) Int. Cl.
    *H01L 21/469* (2006.01)
(52) U.S. Cl. ...................... 438/783; 257/369
(58) Field of Classification Search ........... 438/783; 257/369
    See application file for complete search history.

(56) References Cited

U.S. PATENT DOCUMENTS

| | | | |
|---|---|---|---|
| 6,586,339 B1 | 7/2003 | Plat et al. ............ 438/706 |
| 7,078,333 B2 * | 7/2006 | Goh et al. ............ 438/622 |
| 2004/0104405 A1 | 6/2004 | Huang et al. ............ 257/199 |
| 2005/0042860 A1 * | 2/2005 | Daniels et al. ............ 438/637 |
| 2006/0046400 A1 * | 3/2006 | Burbach et al. ............ 438/282 |
| 2006/0286758 A1 * | 12/2006 | Liang et al. ............ 438/305 |
| 2007/0187727 A1 * | 8/2007 | Ting et al. ............ 257/274 |
| 2009/0108363 A1 * | 4/2009 | Forbes et al. ............ 257/368 |

FOREIGN PATENT DOCUMENTS

DE    10 2004 024 886 A1    12/2005

OTHER PUBLICATIONS

Translation of Official Communication from German Patent Office for German Patent Application No. 10 2006 046 381.1-33 dated Jul. 23, 2007.

* cited by examiner

*Primary Examiner*—N Drew Richards
*Assistant Examiner*—Yu-Hsi Sun
(74) *Attorney, Agent, or Firm*—Williams, Morgan & Amerson, P.C.

(57) ABSTRACT

By providing a silicon cap layer on a compressive silicon nitride layer, the diffusion of nitrogen into sensitive resist material may be efficiently reduced, while the silicon may be converted into a highly compressive silicon dioxide in a later manufacturing stage. Consequently, yield loss due to contact failures during the formation of semiconductor devices requiring differently stressed silicon nitride layers may be reduced.

19 Claims, 6 Drawing Sheets

METHOD FOR REDUCING RESIST POISONING DURING PATTERNING OF STRESSED NITROGEN-CONTAINING LAYERS IN A SEMICONDUCTOR DEVICE

BACKGROUND OF THE INVENTION

1. Field of the Invention

Generally, the present disclosure relates to the field of integrated circuits, and, more particularly, to the manufacture of field effect transistors on the basis of nitrogen-containing dielectric layers, such as stressed contact etch stop layers, used for generating strain in channel regions of the transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. A further issue associated with reduced gate lengths is the occurrence of so-called short channel effects, which may result in a reduced controllability of the channel conductivity. Short channel effects may be countered by appropriately scaling the capacitive coupling of the gate electrode to the channel region, for instance by reducing the thickness of the gate insulation layer, providing enhanced dopant profiles in the channel region and in adjacent drain and source areas and the like. However, some of these design measures, such as increasing the dopant concentration in the channel region or the provision of high-k dielectrics in the gate insulation layer, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, while the reduced channel length may even require enhanced dopant concentrations in order to control short channel effects, thereby making a reduction of the dopant concentration a less attractive approach unless other mechanisms are developed to adjust a desired threshold voltage. Second, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One promising approach in this respect is a technique that enables the creation of desired stress conditions within the channel region of different transistor elements by adjusting the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer of the respective transistor in order to position a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher for compressive stress and up to 1 GPa and significantly higher for tensile stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress.

In one typical process sequence, a contact etch stop layer having tensile stress is formed above the transistors after finishing respective metal silicide regions. In order to protect the silicide regions during the further patterning process, a stop layer formed of silicon dioxide may be provided prior to depositing the tensile contact etch stop layer. Then, a thin etch indicator layer comprised of silicon dioxide is formed on the tensile silicon nitride layer that is used for controlling an etch process to selectively remove the compressive silicon nitride layer from the tensile silicon nitride above the N-channel transistor in a later manufacturing stage. Thereafter, the stressed etch stop layer having the tensile stress may be removed from the P-channel transistor by providing a resist mask and etching the exposed portion of the tensile silicon nitride layer, using the silicon dioxide stop layer as an etch stop. Next, the compressive silicon nitride layer is deposited, which is subsequently removed from the N-channel transistor on the basis of a corresponding resist mask and the previously formed etch indicator layer. Thereafter, silicon dioxide may be formed on the stressed silicon nitride layers to serve as an interlayer dielectric material, which is then patterned to receive contact holes for connecting to respective transistor areas. In this patterning process, a first etch step is performed to etch through the silicon dioxide, wherein the stressed silicon nitride layers may be used as etch stop layers. In a further etch process, the contact opening is driven through the silicon nitride layers to finally land on respective metal silicide regions of the transistors. Next, a conductive material, such as tungsten, may be filled into the contact openings to form respective contact plugs.

It appears, however, that a significant yield loss may be observed after the above-described process sequence due to failures in the contact plugs. It is believed that a dominant source of these failures is caused by irregularities of the lithography process performed during the patterning of the respective stressed silicon nitride layers. Without intending to restrict the present invention to the following explanation, it is assumed that resist residuals may remain after the lithography process for forming a resist mask in order to selectively remove the compressive silicon nitride layer from the N-channel transistor. During the lithography process, radiation is deposited in the resist material at positions defined by the corresponding reticle. The radiation energy affects the local generation of an acidic state, wherein the acid may catalyze a chemical reaction in the resist material that changes the solubility of the resist material. The portions of increased solubility may then be removed by the developer material. For resist materials having a high photo sensitivity at short radiation wavelengths, as are typically used in sophisticated applications, nitrogen may significantly change the photo acidic generator function of the resist material, thereby partially blocking exposed resist portions from being removed during the development process, which is also referred to as resist poisoning. The corresponding non-removed portions may then adversely affect the subsequent etch process, which therefore results in an additional silicon nitride material. If a corresponding non-removed resist portion may therefore have been formed at a position, at which a contact opening is to formed through the silicon nitride material, which may thus have an increased thickness, the etch process may not completely etch through the portion of increased thickness, thereby finally resulting in a contact failure.

In particular, the deposition process for forming the highly compressive silicon nitride requires high amounts of nitrogen to be incorporated into the layer material, which may thus lead to a high probability for resist poisoning.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming stressed dielectric materials having a different type of intrinsic stress above different device regions, such as transistor elements of different conductivity type, wherein a significantly reduced probability for creating contact faults may be achieved by providing an efficient diffusion blocking layer at least above the layer including a moderately high nitrogen content. In some aspects, the diffusion blocking layer may be comprised of an oxidizable material, which may be oxidized in a later manufacturing stage, thereby even further increasing the overall stress component in the corresponding silicon nitride layer.

According to one illustrative embodiment disclosed herein, a method comprises forming a first stress-inducing layer above a first transistor and a second transistor, wherein the first stress-inducing layer comprises silicon and nitrogen. Furthermore, a silicon layer is formed on the first stress-inducing layer and a first resist mask is formed above the first stress-inducing layer so as to cover the first transistor. Moreover, an exposed portion of the first stress-inducing layer is removed from the second transistor.

According to another illustrative embodiment disclosed herein, a method comprises forming a first silicon nitride containing material layer above a first device area and a second device area of a semiconductor device. Next, a first resist mask is formed above the first silicon nitride containing material layer, wherein the first resist mask covers the first silicon nitride containing material layer located above the first device area and exposes the first silicon nitride containing material layer located above the second device area. Furthermore, the first silicon nitride containing material layer is removed above the second device area on the basis of the first resist mask. Next, a second silicon nitride containing material layer is formed above the first and second device areas and a substantially nitrogen-free oxidizable material layer is formed as a cap layer on the second silicon nitride containing material layer. Furthermore, the second silicon nitride containing material layer is removed from the first device area on the basis of a second resist mask.

According to yet another illustrative embodiment disclosed herein, a method comprises forming a first silicon nitride containing material layer above a first device area and a second device area of a semiconductor device. Next, a substantially nitrogen-free oxidizable material layer is formed on the first silicon nitride containing material layer. Thereafter, a first resist mask is formed above the material layer, wherein the first resist mask covers the material layer located above the first device area and exposes the material layer located above the second device area. Furthermore, the first silicon nitride containing material layer and the material layer are removed above the second device area on the basis of the first resist mask. Next, a second silicon nitride containing material layer is formed above the first and second device areas and this layer is selectively removed from the first device area on the basis of a second resist mask.

BRIEF DESCRIPTION OF THE DRAWINGS

The disclosure may be understood by reference to the following description taken in conjunction with the accompanying drawings, in which like reference numerals identify like elements, and in which.

Figure 1A:
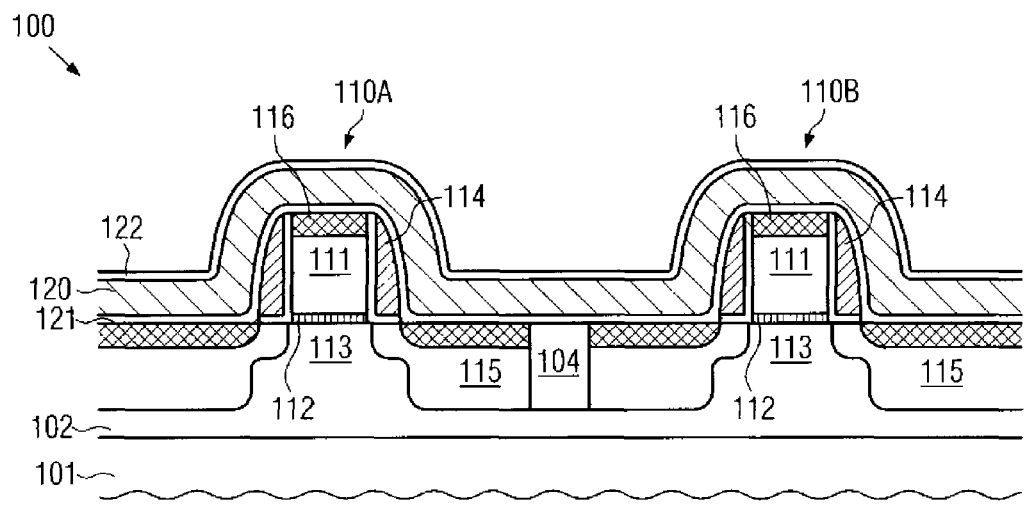
FIGS. 1a-1g schematically illustrate cross-sectional views of a semiconductor device during various manufacturing stages in forming stressed dielectric layers above respective transistor elements on the basis of a cap layer formed from an oxidizable material according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for providing differently stressed nitrogen-containing dielectric layers above respective device areas, such as transistor devices of different conductivity type, with a significantly reduced probability for creating respective contact failures during forming respective contact plugs. As previously explained, it has been recognized that, in particular, the high nitrogen content of silicon nitride layers with high compressive stress may result in a corresponding resist poisoning during the patterning of the stressed overlayers, thereby increasing the risk of yield loss due to incompletely formed contact openings, as is previously described. In order to significantly reduce the probability for resist poisoning, at least during the patterning of the respective silicon nitride layers having high compressive stress, an appropriate cap layer may be provided, which sufficiently reduces the nitrogen diffusion, while nevertheless providing for an efficient process flow without negatively affecting the further device characteristics. To this end, an oxidizable material may be used, which may be formed on the basis of well-established techniques, that exhibits a high degree of compatibility with the corresponding deposition techniques for forming silicon nitride layers, while still providing the required diffusion blocking characteristics. In some illustrative embodiments, the respective cap layer may even be used for further enhancing the efficiency of the corresponding stressed silicon nitride layer by appropriately modifying the characteristics of the cap layer in order to provide a high compressive stress. In one illustrative embodiment, a silicon material may be used as a material for an efficient cap layer, which may have a high degree of compatibility with the preceding process techniques and which may, prior to or after forming a respective resist mask, be treated in an oxidizing ambient in order to efficiently convert the silicon material in a highly compressive silicon dioxide material, thereby enhancing the overall stress characteristics of the underlying silicon nitride layer. As a consequence, production yield may be significantly increased, while even the performance of at least one type of transistor may be increased.

FIG. 1a schematically illustrates a semiconductor device 100 comprising a substrate 101, which may represent any appropriate carrier material having formed thereabove a semiconductor layer 102, which may represent a silicon-based material, i.e., a semiconductor material including a significant amount of silicon atoms, wherein other components, such as germanium, carbon, dopant species as required for adjusting the conductivity of the layer 102 in a highly local fashion and the like, may also be provided. In some illustrative embodiments, the semiconductor layer 102 may be formed on top of a substantially crystalline bulk semiconductor substrate, thereby forming a "bulk" configuration, while, in other illustrative embodiments, as shown in FIG. 1a, the substrate 101 and the semiconductor layer 102 may define a silicon-on-insulator (SOI) configuration, wherein a buried insulating layer (not shown) may dielectrically isolate the substrate 101 and the semiconductor layer 102. It should be appreciated that the semiconductor device 100 may comprise any appropriate architecture, such as a mixture of SOI regions and bulk regions and the like, wherein the crystallographic characteristics of the semiconductor layer 102 may also locally vary, depending on the device requirements. Furthermore, respective isolation structures 104, such as shallow trench isolations, may be provided, wherein, in the embodiment shown in FIG. 1a, the isolation structure 104 may define a first device area 110A and a second device area 110B, which may represent adjacent device regions having a defined size and shape determined by the respective isolation structure 104. In other cases, the first and second device areas 110A, 110B may represent device regions at very different positions within the substrate 101, wherein the isolation structure 104 may represent any intermediate device areas located between the first and second areas 110A, 110B. In one illustrative embodiment, the first device area 110A may be represented by a transistor element, which may for convenience also be referred to as transistor 110A, of a specified conductivity type, while the second device area 110B may be represented by a transistor, also indicated as transistor 110B, of a different conductivity type. As previously explained, in highly scaled transistor devices, the corresponding transistor performance may be significantly enhanced by providing a respective type of strain in the channel regions thereof, wherein typically transistors of different conductivity type may require a different type of strain. It should be appreciated, however, that, in other illustrative embodiments, transistors 110A, 110B may represent transistors of the same conductivity type provided at different device regions having a different degree of sensitivity for a respective strain-inducing mechanism. Also, in this case, an appropriate different patterning regime for different stress-inducing layers may be appropriate and the present invention may also be applied in this case.

For convenience, respective components of the transistors 110A, 110B may be denoted by the same reference numerals, wherein it should be appreciated that, depending on the differences of the first and second transistors 110A, 110B, these components may exhibit respective differences, for instance in view of dopant type and concentration, transistor dimensions and the like. The transistors 110A, 110B may comprise, at this manufacturing stage, respective gate electrodes 111, which may be formed above respective channel regions 113, wherein respective gate insulation layers 112 may separate the gate electrodes 111 from the channel regions 113. Furthermore, a respective sidewall spacer structure 114 may be formed on sidewalls of the gate electrode 111. Moreover, respective drain and source regions 115 having a well-defined vertical and lateral dopant profile may be formed in respective portions of the semiconductor layer 102. Furthermore, metal silicide regions 116, for instance comprised of nickel silicide, cobalt silicide, nickel/platinum silicide and the like, may be formed in the drain and source regions 115 and the gate electrodes 111. In the illustrative embodiment shown in FIG. 1a, the first transistor 110A may represent an N-channel transistor, i.e., the drain and source regions 115 are heavily N-doped, wherein, for a typical crystallographic configuration of the corresponding channel region 113, for instance a length direction thereof, i.e., in FIG. 1 a the horizontal extension of the channel region 113 immediately below the gate insulation layer 112, may be oriented along a <110> crystal axis. In other cases, other crystallographic configurations may be contemplated. In this case, a respective uniaxial tensile strain component along the channel length direction may significantly enhance the electron mobility upon forming a conductive channel in the channel region 113. Similarly, for this crystallographic configuration of the transistor 110B when representing a P-channel transistor, a respective compressive uniaxial strain component in the respective channel region 113 may provide increased mobility of holes. Thus, by providing respective stress-inducing layers above the first and second transistors 110A, 110B, a required type of strain may be generated.

In the embodiment shown, a corresponding silicon nitride containing layer 120 may be formed above the first and second transistors 110A, 110B, wherein the silicon nitride layer 120 may have a high tensile stress so that the performance of the transistor 110A may be enhanced. Furthermore, in some illustrative embodiments, an etch stop layer 121 may be provided, which may be comprised of silicon dioxide, having the required stop characteristics during a subsequent etch process for patterning the layer 120. It should be appreciated, however, that other regimes may be used, in which the etch stop layer 121 may be provided only in a local fashion or may be completely omitted, when a corresponding etch damage in the second transistor 110B in a later manufacturing stage may not unduly affect the overall performance of the transistor 110B. Furthermore, in some illustrative embodiments, an etch indicator layer 122 may be formed on the stressed silicon nitride layer 120, wherein the etch indicator layer 122 may provide an appropriate endpoint detection signal during an etch process for patterning a respective compressive silicon nitride layer in a later manufacturing stage. For example, the etch indicator layer 122 may be formed of a silicon dioxide material formed on the basis of appropriate deposition techniques, while, in other illustrative embodiments, the layer 122 may be formed on the basis of a surface treatment of the layer 120, depending on device and process requirements.

A typical process flow for forming the semiconductor device as shown in FIG. 1a may comprise the following processes. After providing the substrate 101 having formed thereabove the semiconductor layer 102, the device areas 110A, 110B, that is corresponding active regions for forming the transistors therein, may be defined by forming the corresponding isolation structures 104 on the basis of well-established techniques, followed by appropriate implantation processes or other doping mechanisms for establishing the required dopant concentration in the respective portions of the semiconductor layer 102. Thereafter, the gate electrodes 111 and the gate insulation layers 112 may be formed on the basis of advanced deposition and/or oxidation, lithography and patterning techniques. Next, the drain and source regions 115 may be formed in combination with the sidewall spacer structure 114 in order to obtain the desired vertical and horizontal dopant profile of the drain and source regions 115. Next, the metal silicide regions 116 may be formed on the basis of well-established techniques, and thereafter the etch stop layer 121 may be formed by any appropriate deposition technique, such as PECVD, on the basis of an appropriate precursor material such as TEOS and the like. Consequently, the etch stop layer 121 may be formed of silicon dioxide with a high density, thereby providing the desired stop characteristics during a subsequent patterning process. As previously explained, in some illustrative embodiments, the etch stop layer 121 may be omitted or may be patterned in accordance with device requirements. For instance, the etch stop layer 121 may be locally removed from the first transistor 110A in order to allow a direct contact of the stressed silicon nitride layer 120 with respective transistor portions, while a portion of the stop layer 121 may still be maintained in the second transistor 110B.

Next, the silicon nitride layer 120 may be deposited on the basis of well-established process techniques, wherein, for the present example, respective process parameters, such as temperature of the substrate 101 during deposition, pressure, gas flow rates, an intensity of ion bombardment and the like, may be appropriately adjusted in order to obtain a material composition that has the tendency for contracting upon deposition, thereby causing a tensile behavior for inducing the required tensile strain in the respective channel region 113.

For example, a high tensile stress may be generated during deposition in the range of 1 GPa (Giga Pascal) and even significantly higher, wherein, as previously explained, typically a corresponding nitrogen content in the layer 120 is significantly less compared to the corresponding nitrogen content of a highly compressive silicon nitride layer due to the difference in deposition kinetics and process parameters. Next, the cap layer 122 may be formed, if provided, wherein, in some illustrative embodiments, a silicon dioxide layer may be formed on the basis of silane, which may provide a highly efficient process sequence, since the silicon nitride and the silicon dioxide of the layer 122 may be formed in the same deposition tool. In other illustrative embodiments, the cap layer 122 may be formed on the basis of a surface modification process, in which the surface of the silicon nitride layer 120 and/or the surface of the cap layer 122 may be treated on the basis of an oxidizing plasma in order to enhance the diffusion blocking characteristics of the treated surface portion. For instance, even though the nitrogen contents of the layer 120 may be less critical with respect to resist poisoning, it may be appropriate for highly critical applications to modify the surface portion of the silicon nitride layer 120 on the basis of an oxygen plasma or an ozone plasma, thereby forming a highly dense oxidized surface area, which may substantially prevent or at least significantly reduce any nitrogen diffusion during subsequent process steps. If a further silicon dioxide material or any other indicator material may be required, a corresponding further layer may be formed on the modified surface area.

Figure 1B:
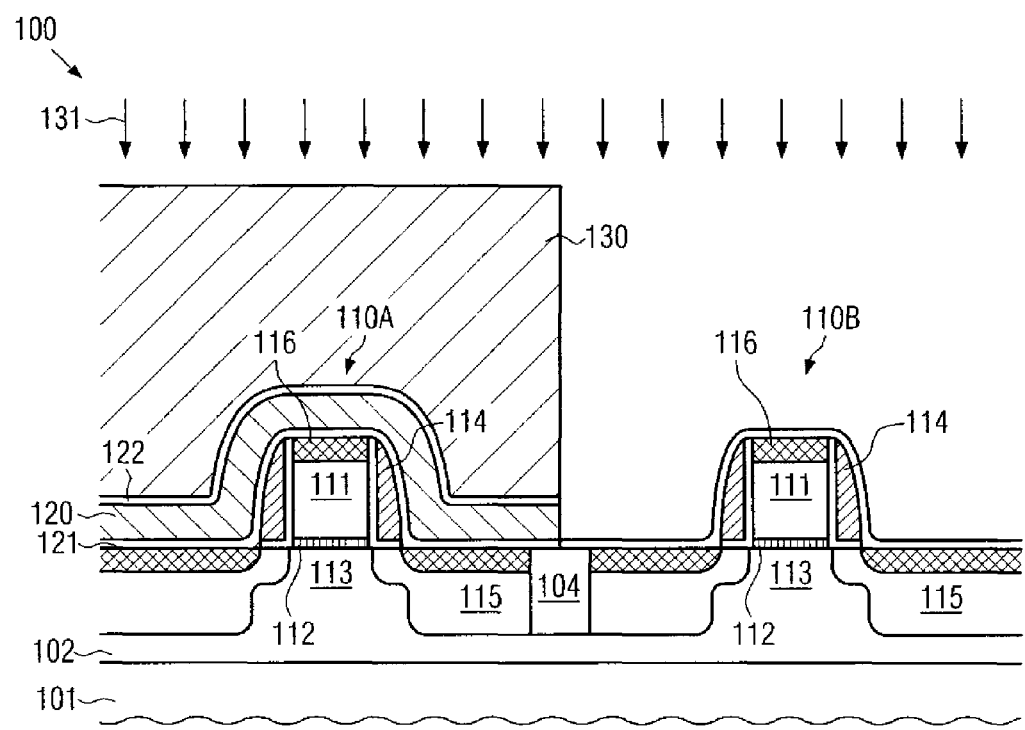

FIG. 1b schematically illustrates the semiconductor device 100 in a further advanced manufacturing stage. Here, a first resist mask 130 is formed so as to cover the first transistor 110A, while exposing the second transistor to an etch ambient 131 for selectively removing the silicon nitride layer 120 and the cap layer 122, if provided. The resist mask 130 may be formed on the basis of well-established lithography techniques, wherein, as previously explained, in some illustrative embodiments, even a reduced probability for nitrogen diffusion into the resist material due to the lower nitrogen contents in the tensile layer 120 may be further reduced when a corresponding efficient cap layer, for instance on the basis of a plasma treatment, may be provided. In other cases, in view of increased process throughput, the cap layer 122 may be formed on the basis of conventional techniques, since the reduced nitrogen contents in the layer 120 may be less critical. The etch process 131 may be performed on the basis of well-established techniques, wherein the process may reliably be stopped on the basis of the etch stop layer 121, while in other cases, as previously explained, the exposed portions of the second transistor 110B may be used for determining an appropriate endpoint of the etch process 131.

Figure 1C:
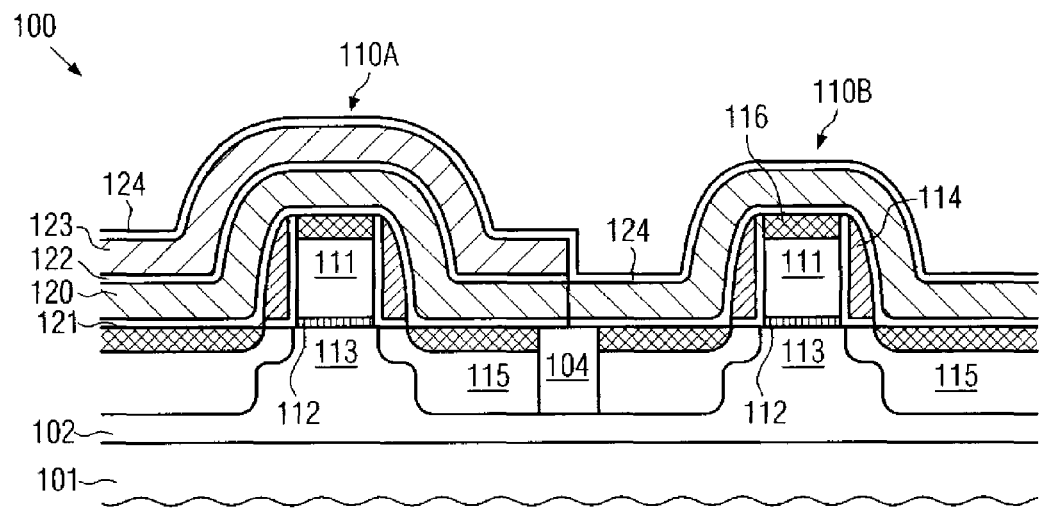

As shown in FIG. 1C, a second silicon nitride layer 123 is formed above the first and second transistors 110A, 110B, wherein, in this embodiment, the silicon nitride layer 123 may have a high compressive stress in order to provide the required strain characteristics in the second transistor 110B. As previously explained, due to corresponding deposition-specific characteristics, a moderately high nitrogen content may be incorporated in the layer 123, thereby providing a significant probability for causing resist poisoning events during the subsequent patterning of the silicon nitride layer 123. Thus, an efficient cap layer 124 may be provided, which may represent a substantially nitrogen-free layer having a sufficient diffusion blocking property in order to significantly reduce the diffusion activity of nitrogen into an overlaying resist material in a later manufacturing stage. It should be appreciated that the term "substantially nitrogen-free" is to be understood as describing a material composition, in which the stoichiometric ratio or formula may not include any nitrogen material, wherein, however, due to any contaminations and process inaccuracies, a certain amount of nitrogen may still be present. For example, a material containing nitrogen with an amount of approximately 0.5 atomic percent with respect to the entirety of other components of the material or significantly less may be considered as a substantially nitrogen-free material. In one illustrative embodiment, the cap layer 124 may represent an oxidizable material, which may be efficiently converted into an oxide material in order to provide an additional compressive stress component. In one illustrative embodiment, the cap layer 124 may be comprised of silicon, which may provide sufficient nitrogen blocking characteristics while also exhibiting a high degree of process compatibility with the previous and subsequent process steps. Furthermore, the silicon may be efficiently converted into silicon dioxide in a later stage, thereby imparting a high degree of compressive stress to the underlying silicon nitride layer 123 and thus even further enhancing the efficiency thereof. In other illustrative embodiments of the present invention, the cap layer 124 may be formed on the basis of other materials, such as silicon carbide, amorphous carbon, and the like, which may be efficiently removed on the basis of a plasma etch process in a later stage, and which may also be converted into a non-conducting oxide material upon exposure to an oxidizing ambient. The layer 124 may, in some illustrative embodiments, be formed in the same deposition tool as the silicon nitride layer 123, thereby providing an efficient process flow, since any undue transport activities of the substrate 101 may be avoided. For example, an in situ deposition process may be performed so as to first deposit the compressive silicon nitride layer 123, followed by the layer 124 when comprised of silicon. In other cases, when a respective exposure to carbon materials may not be considered inappropriate, also respective in situ processes may be performed on the basis of silicon carbide, silicon oxycarbide, amorphous carbon and the like.

Figure 1D:
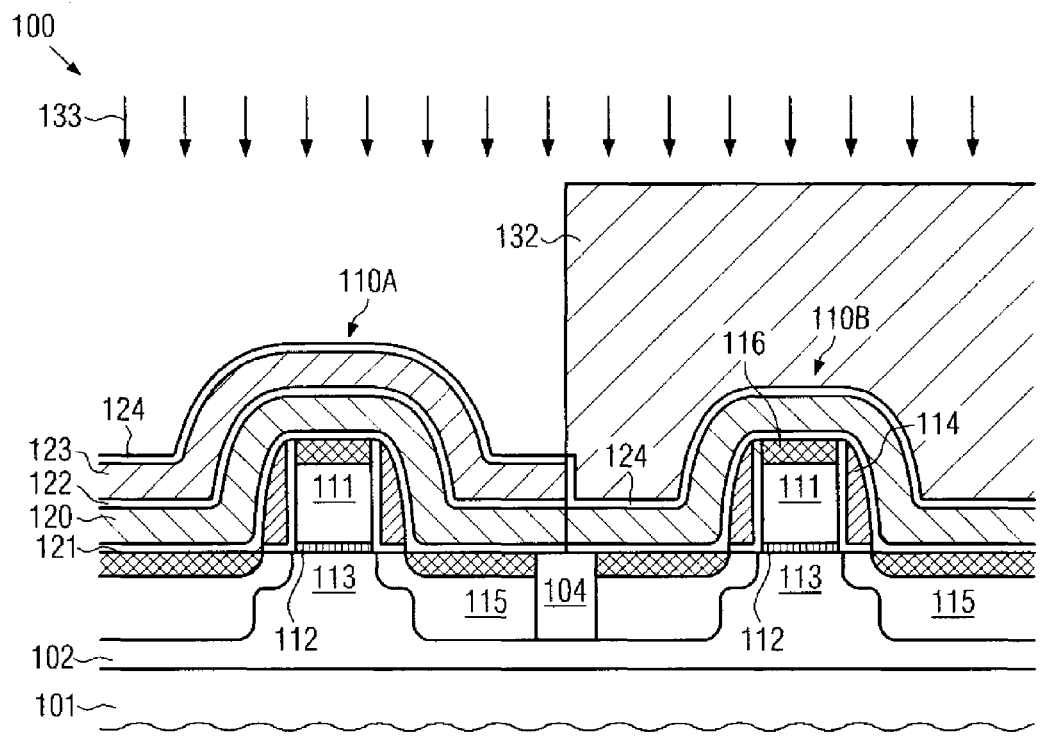

FIG. 1d schematically illustrates the semiconductor device 100 with a second resist mask 132 formed above the second transistor 110B, while exposing the first transistor 110A, the corresponding cap layer 124 and the compressive silicon nitride layer 123 to a further etch ambient 133. As previously explained, during forming the resist mask 132, an undue diffusion of nitrogen into the corresponding resist material may be significantly suppressed on the basis of the cap layer 124, so that exposed portions of the resist material above the first transistor 110A may be removed with high reliability. Hence, the corresponding material of the layers 124 and 123 in the first transistor 110A may be efficiently removed on the basis of the etch process 133. The process 133 may be controlled on the basis of the indicator layer 122, if provided, while, in other illustrative embodiments, even a certain stop effect of the indicator layer 122 may be achieved, for instance on the basis of the previously described plasma treatment.

Figure 1E:
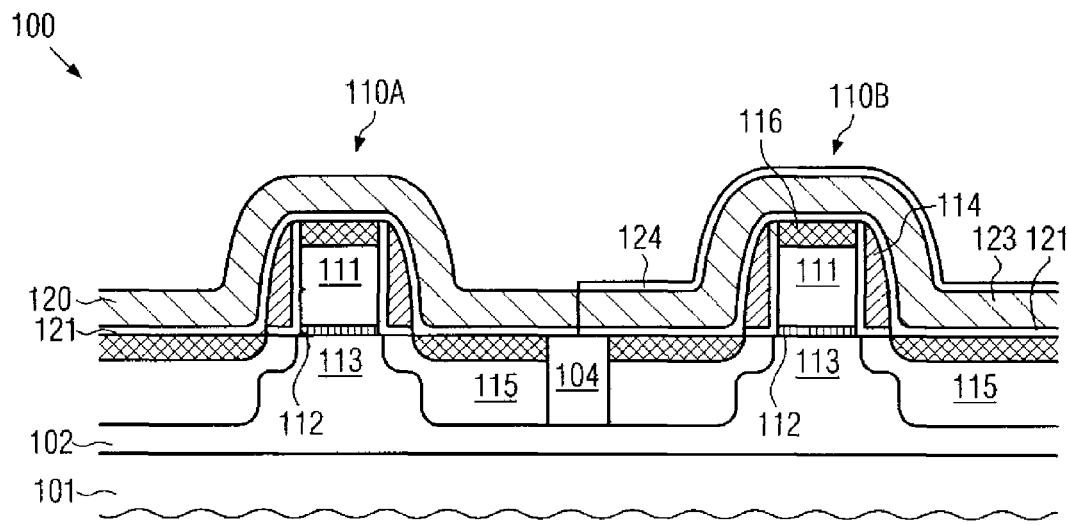

FIG. 1e schematically illustrates the semiconductor device 100 after removing the resist mask 132 on the basis of well-established recipes, wherein the ability for generating any undue material residues stemming from the compressive silicon nitride layer 123 is also significantly reduced, as described above.

Figure 1F:
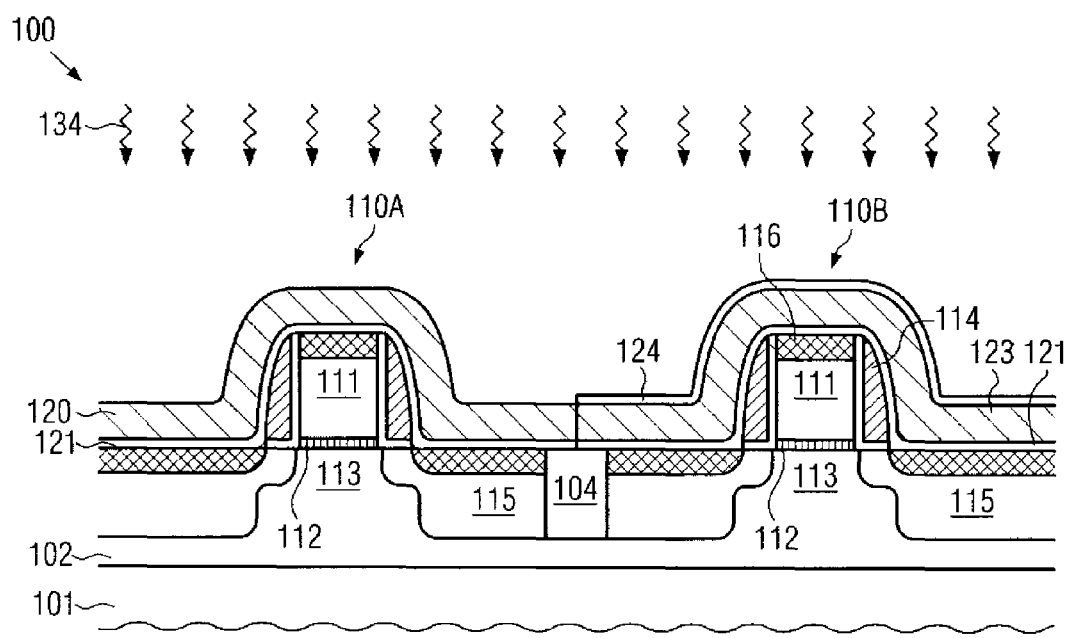

FIG. 1f schematically illustrates the semiconductor device 100 according to illustrative embodiments of the present invention in which the device 100 is exposed to an oxidizing ambient 134, for instance an oxygen or ozone treatment at elevated temperatures in order to convert the oxidizable material 124, for instance the silicon layer, into a highly non-conductive material, wherein additionally a high intrinsic compressive stress component may be generated due to the increased volume of, for instance, silicon dioxide with respect to silicon. In some embodiments, the treatment 134 may be performed as a plasma-based treatment, wherein any appropriate plasma-based process tool may be used. For example, an oxidizing ambient may be established in a process chamber as used for removing the resist mask 132, which is typically performed on the basis of an oxygen plasma. In other cases, any other appropriate process tool, such as a furnace and the like, may be used.

Figure 1G:
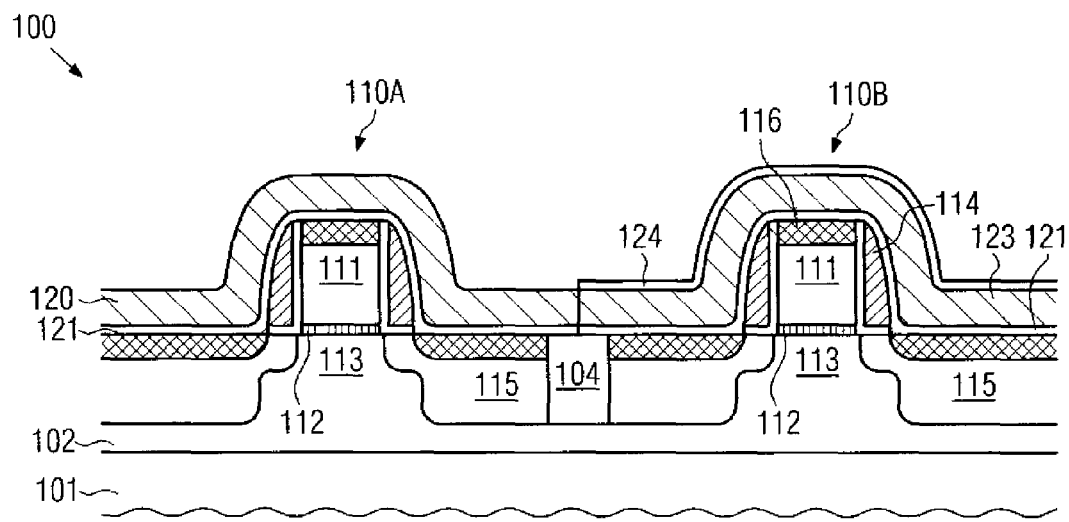

FIG. 1g schematically illustrates the semiconductor device 100 after the oxidation 134, wherein the remaining cap layer 124 is converted into a respective non-conductive oxide. In this case, the overall stress produced by the layers 123 and 124 may even be enhanced, as is previously explained.

Thereafter, the further processing may be continued by depositing an appropriate interlayer dielectric material, such as silicon dioxide, on the basis of well-established techniques, such as high density plasma chemical vapor deposition, sub-atmospheric chemical vapor deposition and the like, followed by a well-established patterning process for forming respective contact openings, wherein the stressed layers 120 and 123 may be used as efficient etch stop layers for controlling a first etch step. Thereafter, a further respective etch step may be performed in order to etch through the remaining materials of the layers 123, 120 to finally connect to the respective metal silicide regions 116 wherein, as previously explained, a significantly reduced probability for contact failures may be achieved.

In the embodiments described above, the oxidation process 134 is performed after patterning the compressive layer 123, thereby providing a high degree of process compatibility with respect to conventional techniques when forming the cap layer 124. In other illustrative embodiments, the treatment in the oxidizing ambient 134 may be performed immediately after deposition of the layer 124, thereby providing a moderately dense oxide material, which may also provide the desired nitrogen blocking characteristics. Advantageously, the respective treatment 134 may then be performed as an in situ process with respect to the formation of the layers 123, 124, thereby also providing a highly efficient process flow.

With respect to FIGS. 2a-2d, further illustrative embodiments will now be described in more detail, in which a compressive silicon nitride layer may be formed first and thereafter a respective tensile layer may be provided.

Figure 2A:
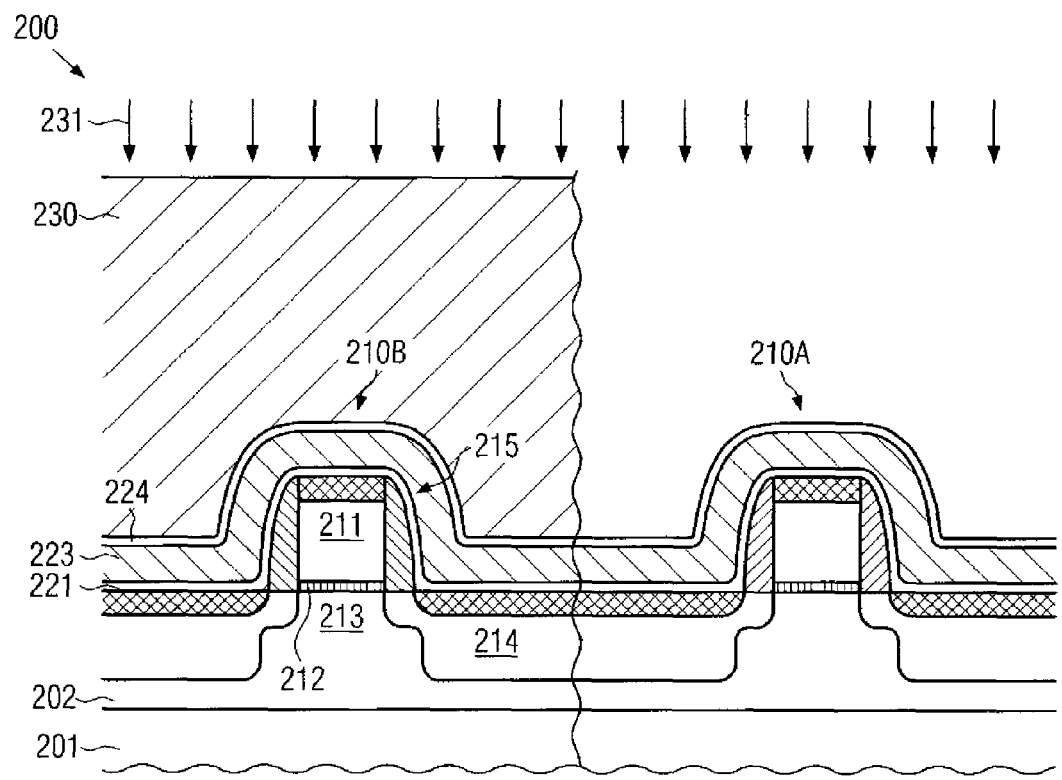
FIGS. 2a-2d schematically illustrate cross-sectional views of a semiconductor device during various manufacturing stages in forming highly stressed dielectric material layers above different transistor devices in accordance with yet other illustrative embodiments disclosed herein.

FIG. 2a schematically illustrates a semiconductor device 200 comprising a substrate 201 having formed thereabove a semiconductor layer 203. Furthermore, a first device area 210A may be provided, which may represent a first transistor, such as an N-channel transistor. Similarly, a second device area 210B may be defined, which may represent a second transistor element, such as a P-channel transistor. The corresponding transistors 210A, 210B may comprise respective components, such as gate electrodes 211, gate insulation layers 212, spacer structures 214, drain and source regions 215, respective channel regions 213 and metal silicide regions 216. With respect to these components, the same criteria apply as previously explained with reference to the semiconductor device 100. Thus, a detailed description of these components may be omitted. Furthermore, the semiconductor device 200 may comprise in this manufacturing stage a silicon nitride layer 223, which may comprise a high compressive stress in order to enhance the performance of the second transistor 210B, as is previously explained. In some illustrative embodiments, a respective etch stop layer 221 may be formed above the first and second transistors 210A, 210B wherein, as previously explained, the etch stop layer 221 may be omitted or may only be partially provided, for instance above the first transistor 210A. Furthermore, the device 200 may comprise a cap layer 224 having an enhanced diffusion blocking characteristic that may significantly reduce nitrogen diffusion into an overlaying resist material. In one illustrative embodiment, the layer 224 may be provided as a silicon layer, while, in other illustrative embodiments, any other appropriate substantially nitrogen-free materials may be used. Furthermore, a resist mask 230 is formed in order to expose the first transistor 210A, while covering the second transistor 210B.

A typical process flow for forming the semiconductor device 200 may comprise substantially the same process techniques as described with reference to the device 100. In particular, the compressive silicon nitride layer 223 and the cap layer 224 may be formed on the basis of respective process techniques, as are previously described with reference to the layers 123 and 124. Similarly, the resist mask 230 may be formed on the basis of well-established recipes, wherein the cap layer 224 provides a significantly reduced probability for resist poisoning. Hence, a corresponding etch process 231 may reliably remove exposed material of the layers 224 and 223.

Figure 2B:
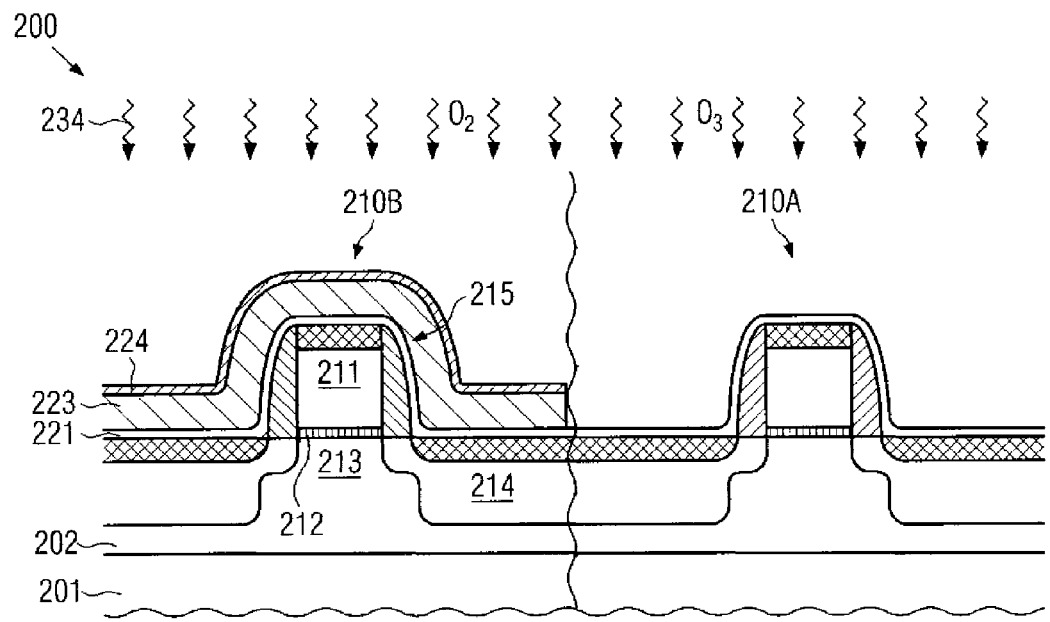

FIG. 2b schematically illustrates the semiconductor device 200 after the etch process 231 and after the removal of the resist mask 230. Furthermore, the device 200 is exposed to an oxidizing ambient 234, which may be based on oxygen and/or ozone with or without a plasma, as previously explained for the treatment 134. Thus, the oxidizable material of the cap layer 224 may be efficiently converted into a non-conductive oxide, for instance a silicon dioxide, wherein additional compressive stress may be generated, which may thus contribute to a more efficient strain-inducing mechanism for the transistor 210B. In some illustrative embodiments, a thickness of the cap layer 224 may be provided in the range of 20 or even more nanometers, so as to nevertheless provide increased transistor performance even if a significant amount of material erosion may occur in a subsequent etch process for patterning a respective silicon nitride layer having a high tensile stress. Moreover, by providing an increased thickness for the cap layer 224 in the above-specified range, the stop capabilities of the modified layer 224 as shown in FIG. 2b may enhance the corresponding controllability of the respective patterning process.

In some illustrative embodiments, the oxidation process 234 may be performed in a later stage, for instance, when an interaction of the ambient of the process 234 with the materials in the first device region 210A is considered inappropriate. In this case, the cap layer 224 may also act as an etch indicator layer in a subsequent patterning process, and the oxidation 234 may be performed after patterning the tensile stress inducing layer still to be formed.

Figure 2C:
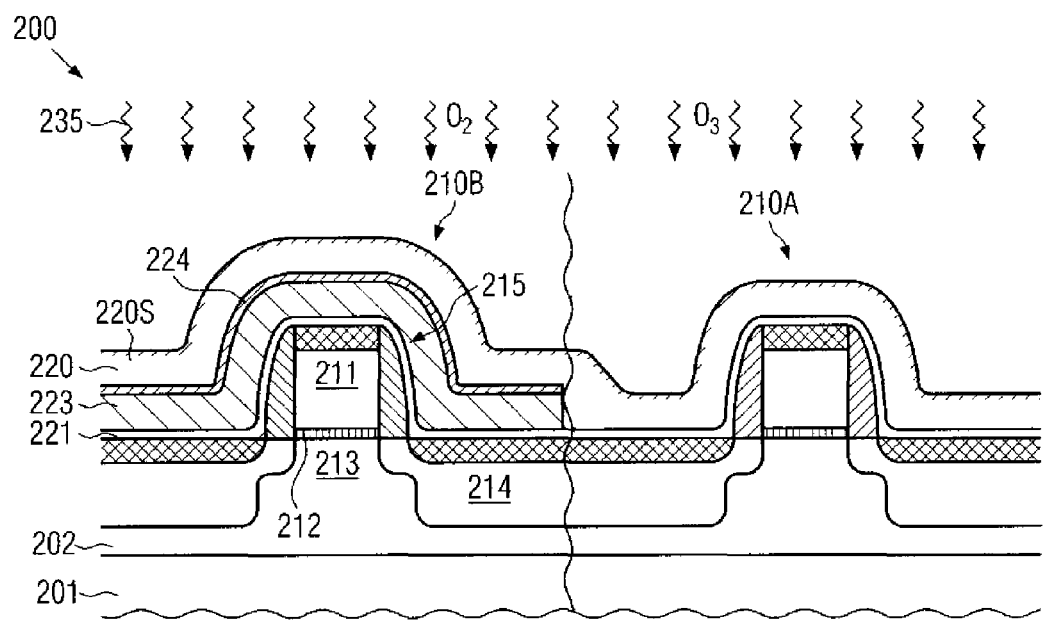

FIG. 2c schematically illustrates the semiconductor device 200 in a further advanced manufacturing stage. A second silicon nitride layer 220 having a high tensile stress is formed above the first and second transistors 210A, 210B, wherein, in one illustrative embodiment, a plasma treatment 235 may be performed in an oxidizing ambient on the basis of oxygen and/or ozone in order to modify the surface characteristics of the silicon nitride layer 220. For example, if highly sophisticated lithography processes may have to be performed on the basis of extremely sensitive resist materials, even the reduced probability for a nitrogen diffusion may not be acceptable, and hence the plasma treatment 235 may efficiently "seal" the surface of the silicon nitride layer 220, thereby providing an enhanced surface portion 220S comprising dense silicon oxide material, which may reliably confine the corresponding nitrogen in the layer 220. In illustrative embodiments, the plasma treatment 235 may be performed in situ with the deposition process for forming the layer 220, while, in other cases, a dedicated process chamber may be used. In still other illustrative embodiments, the plasma treatment 235 may be omitted, when a corresponding diffusion probability of nitrogen of the layer 220 is less critical.

Figure 2D:
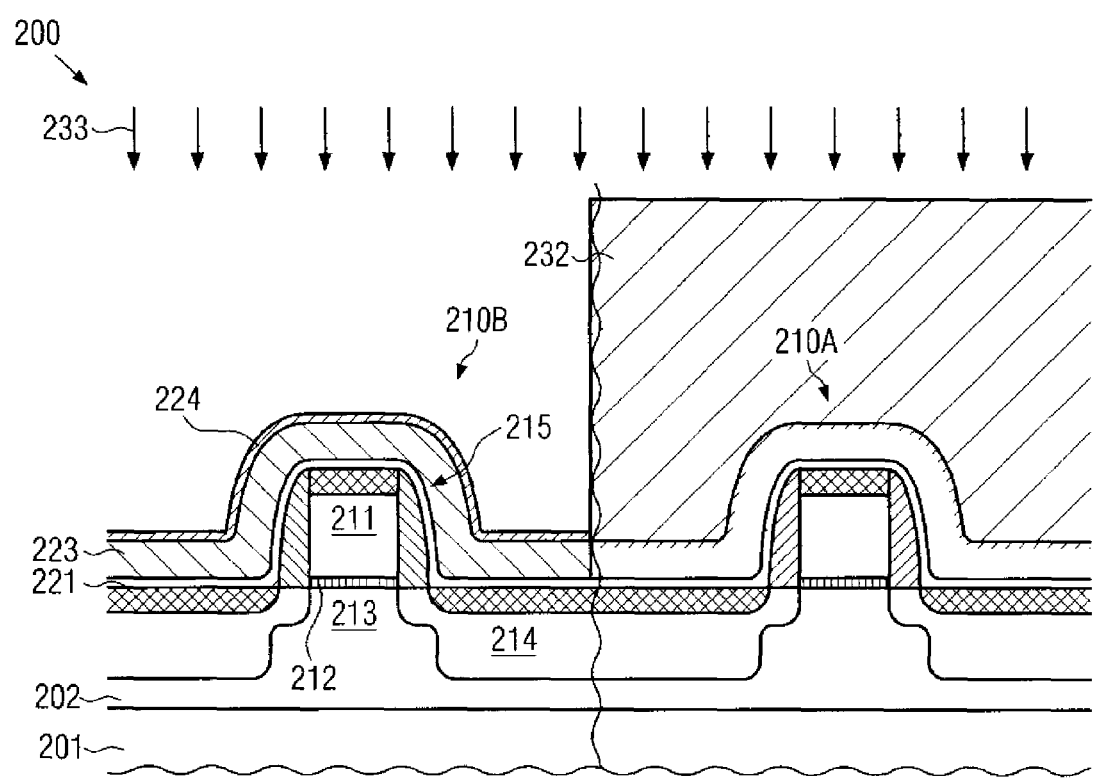

FIG. 2d schematically illustrates the semiconductor device 200 in a further advanced manufacturing stage. Here, a second resist mask 232 is formed to expose the second transistor 210B, while covering the first transistor 210A, when the layer 220 is provided with the enhanced surface characteristics provided by the layer 220S. The resist mask 232 may be formed with high reliability, that is, the probability for obtaining any non-removed resist residues may be significantly reduced, thereby also enhancing the performance of an etch process 233 for selectively removing the layer 220 from the second transistor 210B. Furthermore, the modified cap layer 224 may be used as an appropriate layer for controlling the etch process 233, for instance by providing an efficient endpoint detection signal and/or by even substantially acting as an etch stop layer so that, in some illustrative embodiments, a pronounced amount of oxide material may be maintained, thereby providing an increased degree of compressive stress, as previously explained. In other cases, as previously described, the cap layer 224 may be used for controlling the etch process without being converted into oxide material. In this case, the oxidation 234 may be performed during and/or after removing the resist mask 232. Thereafter, the further processing may be continued as is previously described with reference to the device 100, i.e., a respective inter-layer dielectric material may be formed and thereafter respective contact openings may be provided with increased reliability due to the provision of at least the cap layer 224.

As a result, the subject matter disclosed herein provides an efficient process regime having a high degree of compatibility with conventional process techniques, while nevertheless providing an enhanced performance of the respective lithography process by efficiently suppressing diffusion of nitrogen into sensitive resist material. A respective cap layer may be provided in the form of a substantially nitrogen-free material providing sufficient diffusion blocking characteristics, wherein, after deposition, the material may even be converted into an oxide material, thereby further enhancing the efficiency of the compressive silicon nitride layer. In one illustrative embodiment, silicon material may be used as the capping material, which may be formed with a high degree of compatibility with the preceding deposition of the silicon nitride material, thereby resulting in an efficient process regime. Furthermore, the provision of the cap layer may be applied to any process sequence, that is, forming the compressive silicon nitride layer first or forming the tensile silicon nitride first, depending on the process requirements, while still obtaining an efficient overall process flow, in which the strain-inducing mechanism at least for the P-channel transistors may be increased while the probability for contact failures may be significantly reduced. In still other illustrative embodiments, the provision of the cap layer having the enhanced diffusion blocking characteristics may be combined with additional oxygen or ozone-based plasma treatments in order to even further enhance the performance of the respective lithography processes for patterning the differently stressed silicon nitride layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing layer above a first transistor and a second transistor, said first stress-inducing layer comprising silicon and nitrogen;
    forming a silicon layer on said first stress-inducing layer;
    performing an oxidizing process to oxidize said silicon layer formed above said first transistor;
    forming a first resist mask above said first stress-inducing layer to cover said first transistor, said first resist mask exposing a portion of said first stress-inducing layer;
    removing said exposed portion of said first stress-inducing layer from above said second transistor
    forming a contact opening through said oxidized silicon layer.

2. The method of claim 1, wherein said first stress-inducing layer has a compressive stress.

3. The method of claim 1, wherein said oxidizing is performed after selectively removing said first stress-inducing layer from said second transistor.

4. The method of claim 1, wherein said oxidizing process is performed prior to forming said first resist mask.

5. The method of claim 1, further comprising forming a second stress-inducing layer above said first and second transistors and selectively removing said second stress-inducing layer from above said first transistor, said second stress-inducing layer comprising silicon and nitrogen.

6. The method of claim 5, wherein said second stress-inducing layer has an intrinsic tensile stress and wherein said second stress-inducing layer is formed prior to forming said first stress-inducing layer.

7. The method of claim 6, wherein forming said second stress-inducing layer comprises depositing a silicon nitride material having tensile stress on an etch stop layer and forming an etch indicator layer on said stressed silicon nitride material.

8. The method of claim 7, wherein forming said second stress-inducing layer further comprises performing a plasma treatment in an oxidizing ambient.

9. The method of claim 6, wherein said oxidizing process is performed after selectively removing said first stress-inducing layer from said second transistor.

10. The method of claim 6, wherein said oxidizing process is performed prior to forming said first resist mask.

11. A method, comprising:
    forming a first silicon nitride containing material layer above a first device area and a second device area of a semiconductor device;
    forming a first resist mask above said first silicon nitride containing material layer, said first resist mask covering said first silicon nitride containing material layer located above said first device area and exposing said first silicon nitride containing material layer located above said second device area;
    removing said first silicon nitride containing material layer above said second device area on the basis of said first resist mask;
    forming a second silicon nitride containing material layer above said first and second device areas;

forming a substantially nitrogen-free oxidizable material layer as a cap layer on said second silicon nitride containing material layer;

oxidizing said cap layer;

removing said second silicon nitride containing material layer from above said first device area on the basis of a second resist mask; and forming a contact opening through said oxidized cap layer.

12. The method of claim 11, wherein the contents of nitrogen in said first silicon nitride containing material layer is less compared to the contents of nitrogen in said second silicon nitride containing material layer.

13. The method of claim 11, wherein said cap layer is oxidized after removing said second silicon nitride containing material layer from said second device area.

14. The method of claim 11, wherein said cap layer is oxidized prior to removing said second silicon nitride containing material layer from said second device area.

15. The method of claim 11, wherein said oxidizable material layer is comprised of silicon.

16. The method of claim 11, wherein oxidizing said cap layer comprises performing a plasma treatment in an oxidizing ambient prior to forming said first resist mask.

17. A method, comprising:

forming a first silicon nitride containing material layer above a first device area and a second device area of a semiconductor device;

forming a substantially nitrogen-free oxidizable material layer as a cap layer on said first silicon nitride containing material layer;

oxidizing said cap layer;

forming a first resist mask above said material layer, said first resist mask covering said material layer located above said first device area and exposing said material layer located above said second device area;

removing said first silicon nitride containing material layer and said material layer above said second device area on the basis of said first resist mask;

forming a second silicon nitride containing material layer above said first and second device areas;

removing said second silicon nitride containing material layer from said first device area on the basis of a second resist mask; and forming a contact opening through said oxidized cap layer.

18. The method of claim 17, wherein the contents of nitrogen in said first silicon nitride containing material layer is higher compared to the contents of nitrogen in said second silicon nitride containing material layer.

19. The method of claim 17, further comprising wherein oxidizing said cap layer comprises performing a plasma treatment in an oxidizing ambient after forming said second silicon nitride containing material layer.

* * * * *